US011122717B2

(12) United States Patent
Ohkubo et al.

(10) Patent No.: US 11,122,717 B2
(45) Date of Patent: Sep. 14, 2021

(54) ELECTRONIC CONTROL DEVICE

(71) Applicant: HITACHI AUTOMOTIVE SYSTEMS, LTD., Hitachinaka (JP)

(72) Inventors: Yoko Ohkubo, Ibaraki (JP); Hideyuki Sakamoto, Ibaraki (JP); Yusaku Katsube, Tokyo (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 16/493,163

(22) PCT Filed: Jan. 31, 2018

(86) PCT No.: PCT/JP2018/003099
§ 371 (c)(1),
(2) Date: Sep. 11, 2019

(87) PCT Pub. No.: WO2018/179799
PCT Pub. Date: Oct. 4, 2018

(65) Prior Publication Data
US 2020/0060050 A1    Feb. 20, 2020

(30) Foreign Application Priority Data

Mar. 30, 2017    (JP) .............................. JP2017-066635

(51) Int. Cl.
*H05K 9/00*    (2006.01)
*H05K 1/02*    (2006.01)
(Continued)

(52) U.S. Cl.
CPC ......... *H05K 9/0049* (2013.01); *H05K 1/0216* (2013.01); *H05K 1/181* (2013.01);
(Continued)

(58) Field of Classification Search
CPC .. H05K 9/0024; H05K 9/0049; H05K 1/0216; H05K 1/181; H05K 5/0017;
(Continued)

(56) References Cited

U.S. PATENT DOCUMENTS

| 2011/0012255 A1* | 1/2011 | Suganuma ............ H01L 23/433 257/712 |
| 2011/0155450 A1* | 6/2011 | Suzuki .................. G06F 1/1633 174/520 |
| 2011/0273834 A1* | 11/2011 | Moriai ............... H05K 7/20472 361/679.32 |
| 2012/0168214 A1* | 7/2012 | Kashiwagi .......... H01L 23/3121 174/257 |

(Continued)

FOREIGN PATENT DOCUMENTS

| JP | H06-69680 A | 3/1994 |
| JP | 2000-244168 A | 9/2000 |

(Continued)

OTHER PUBLICATIONS

International Search Report with English translation and Written Opinion issued in corresponding application No. PCT/JP2018/003099 dated Apr. 17, 2018.

*Primary Examiner* — Hung S. Bui
*Assistant Examiner* — Sagar Shrestha
(74) *Attorney, Agent, or Firm* — Foley & Lardner LLP

(57) ABSTRACT

To obtain, in an on-board control device, a shield effect against noise radiated from an electronic component.
The present invention includes: an electronic component 103; a metal housing 101 which covers at least a part of the electronic component 103; a metal portion 105 which is provided so that the electronic component 103 is disposed between the metal portion 105 and the metal housing 101; and a shield structure which shields radiation noise from the electronic component 103 by electrostatic capacitive coupling formed between the metal portion 105 and the metal housing 101.

12 Claims, 4 Drawing Sheets

(51) Int. Cl.
*H05K 1/18* (2006.01)
*H05K 5/00* (2006.01)
*H05K 5/02* (2006.01)
*H05K 5/04* (2006.01)
*B60R 16/023* (2006.01)

(52) U.S. Cl.
CPC ......... *H05K 5/0017* (2013.01); *H05K 5/0026* (2013.01); *H05K 5/0247* (2013.01); *H05K 5/04* (2013.01); *B60R 16/0239* (2013.01); *H05K 2201/10371* (2013.01)

(58) Field of Classification Search
CPC ...... H05K 5/0026; H05K 5/0247; H05K 5/04; H05K 2201/10371; H05K 1/02; H05K 7/04; H05K 9/00; B60R 16/0239
See application file for complete search history.

(56) References Cited

U.S. PATENT DOCUMENTS

| | | | |
|---|---|---|---|
| 2013/0293322 A1* | 11/2013 | Alderton | H01P 3/121 333/208 |
| 2015/0022989 A1* | 1/2015 | Dunphy | H05K 3/222 361/783 |
| 2015/0282394 A1 | 10/2015 | Yumi | |
| 2015/0305210 A1* | 10/2015 | Yu | H01L 23/552 361/767 |
| 2016/0262259 A1* | 9/2016 | Ueyama | H05K 1/0216 |
| 2017/0179041 A1* | 6/2017 | Dias | H01L 21/31111 |
| 2018/0020558 A1* | 1/2018 | Saito | H01R 12/716 |

FOREIGN PATENT DOCUMENTS

| | | |
|---|---|---|
| JP | 2001-053482 A | 2/2001 |
| JP | 2012-146822 A | 8/2012 |
| JP | 2015-079911 A | 4/2015 |
| JP | 2015-185741 A | 10/2015 |

* cited by examiner (a) DISTANCE d BETWEEN SUBSTRATE AND METAL HOUSING (b) DISTANCE d AND EMISSION LEVEL

ELECTRONIC CONTROL DEVICE

TECHNICAL FIELD

The present invention relates to an electronic control device.

BACKGROUND ART

Inside electronic control devices, there is a printed circuit board on which a semiconductor device, etc., are mounted, and unnecessary radiation noise is generated due to the operating current of the semiconductor device. is desirable that this radiation noise be as low as possible, so that other devices are not affected thereby. The tolerance level of such radiation noise is standardized by comite international special des perturbations radioelectriques (CISPR), which is a special committee of the international electrotechnical commission (IEC), and a specification is provided of radiation noise from component modules mounted on automobiles, for frequencies up to 960 MHz.

One means for suppressing radiation noise is to use shield cases to cover printed circuit boards. The abstract of PTL 1 indicates that "a shield area 6 is formed by standing surface portions 3 projected from one surface of a housing 1 and lateral surfaces 5 of the housing 1, a substrate 7 having electronic components mounted thereon is fixably disposed inside this shield area 6, a cover 2 covering the upper surface of the shield area 6 is provided so as to contact the standing surface portions 3 and the lateral surfaces 5 of the housing 1, and the substrate 7 having electronic components mounted thereon is covered by the standing surface portions 3, the lateral surfaces 5 of the housing 1, and the cover 2.

CITATION LIST

Patent Literature

PTL JP 2001-53482 A

SUMMARY OF INVENTION

Technical Problem

With regard to an electronic control device to be used for automobiles, it is necessary to reduce the influence of vibration, such as noise. In PTL 1, if the housing does not have sufficient strength and machining accuracy, the housing and the cover may warp due to the influence of vibration, and parts of the cover and the housing that are close to one another, with the exception of the screw-fastened part, may collide with one another to generate noise. Due to this, countermeasures are considered such as increasing the strength and machining accuracy, or arranging the housing and the cover apart from one another so that, even if the housing and cover vibrate, collision does not occur at any part other than the screw-fastened part. However, cost would increase with the former countermeasure, and radiation noise would leak from the gaps between the housing and the base with the latter countermeasure.

The present invention has been made in view of the above problems, and aims to obtain, in a vehicle control device, a shield effect against noise radiated from an electronic component.

Solution to Problem

In order to achieve the above-described aim, the present invention for example includes: an electronic part; a metal housing which covers at least a part of the electronic component; a metal portion which is provided so that the electronic component is disposed between the metal portion and the metal housing; and a shield structure which shields radiation noise from the electronic component by electrostatic capacitive coupling formed between the metal portion and the metal housing.

Advantageous Effects of Invention

According to the present invention, a shield effect against noise radiated from an electronic component can be obtained in a vehicle control device.

DESCRIPTION OF EMBODIMENTS

In the following, an embodiment of the present invention is described, with reference to the attached drawings. The present embodiment is related to an electronic control device that is used in an automobile, a construction machine, or the like and has a semiconductor device mounted thereon.

Figure 1:
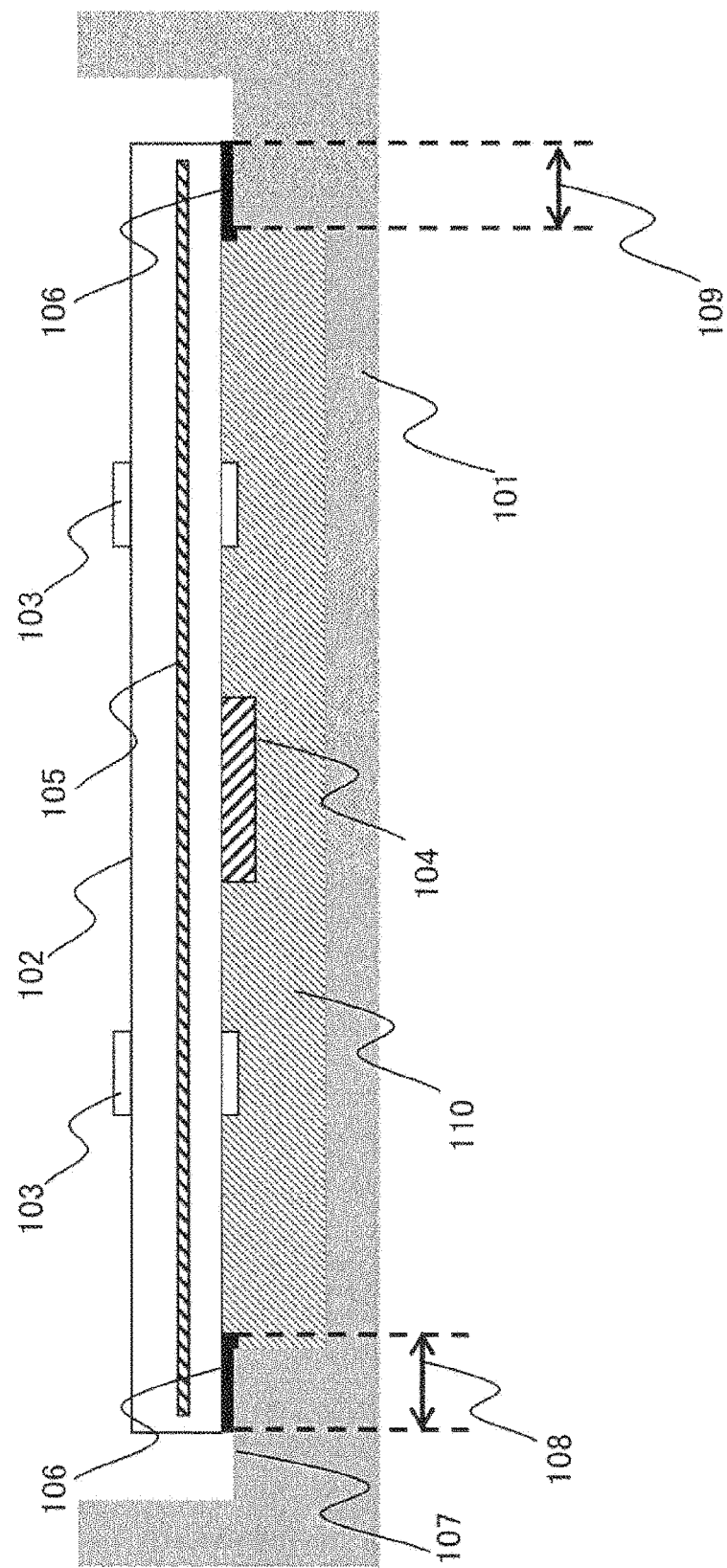
FIG. 1 is a cross-sectional view of an electronic control device according to one embodiment of the present invention.

FIG. 1 is a cross-sectional view of the electronic control device according to one embodiment of the present invention. The electronic control device is configured to include a metal housing 101 and a substrate 102.

The substrate 102 has an inner-layer copper foil pattern (metal portion) 105 in the inside thereof. Copper foil patterns (not illustrated) are also present on the surfaces at both sides of the substrate 102, and a plurality of electronic components 103 are mounted on those copper foil patterns and soldered-bonded. The inner-layer copper foil pattern 105 inside the substrate 102 serves as a ground of the electronic control device, and has a shape substantially similar to the outer shape of the substrate 102 and is formed such that that the entire inner layer is painted out thereby. The copper foil patterns at the surface and in the inside are electrically connected by vias, etc., in accordance with the circuit desired.

Meanwhile, die-cast aluminum with its light weight and high processability is recommended for the metal housing 101. The metal housing 101 has a container-like shape and includes, in the inside thereof, a mounting portion 107 for installing the substrate 102.

The substrate 102 has solder resist applied onto the surfaces thereof. The solder resist has been applied in the printed circuit board manufacturing process. The solder resist is for preventing solder from adhering to copper foil patterns other than contact points where the solder provides electric connection and forming short-circuits, during the above-described solder-bonding of the electronic components. At least a contact portion 106 between the substrate 102 and the metal housing 101 is covered by the solder resist and a width 108 of the solder resist is made greater than a width 109 of contact between the mounting portion 107 and the substrate 102 at the contact portion 106, whereby electric connection between the substrate 102 and the metal housing 101 is prevented.

A radiation noise source 104 is a control processor, a large-scale integrated circuit (LSI), a field-programmable gate array (FPGA), a memory, a termination resistor of a clock line, or the like, and generates electromagnetic noise at the periphery thereof when current with a large change rate transiently flows therethrough. The radiation noise source 104 is installed in a shield space 110 surrounded by the metal housing 101 and the inner-layer copper foil pattern 105 inside the substrate 102, so that the electromagnetic noise is prevented from leaking to the outside. That is, the radiation noise source 104 is disposed to face the bottom surface of the metal housing 101, which has a container-like shape.

Figure 2:
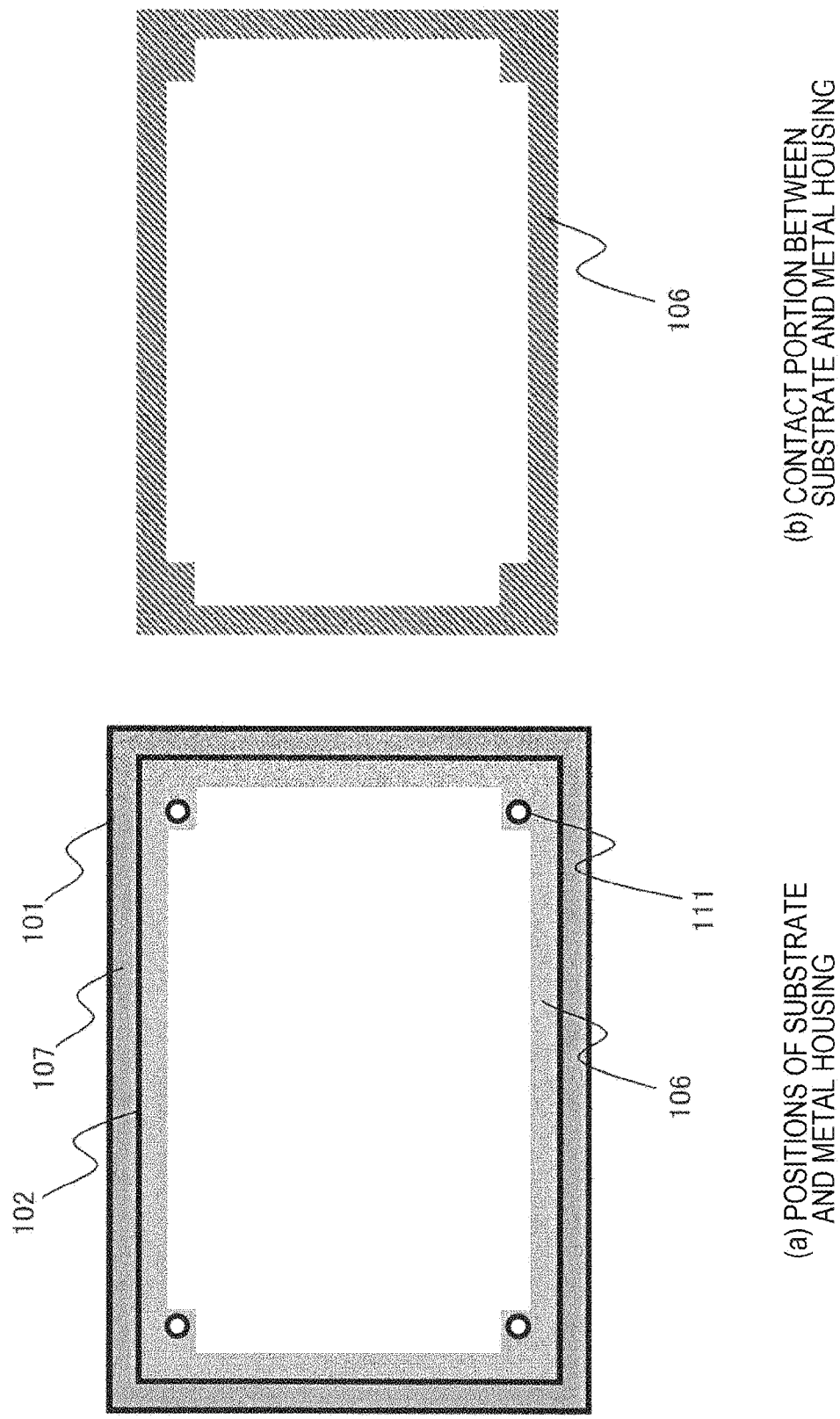
FIG. 2 is a top view of the electronic control device according to one embodiment of the present invention.

FIG. 2 is a top view of the electronic control device according to a first embodiment.

As shown in FIG. 2(a), the substrate 102 is mounted on the mounting portion 107 of the metal housing 101 after the electronic components 103 have been solder-bonded, and is fixed to the metal housing 101 by using fastening members such as screws 111. The radiation noise source 104 is mounted on the rear surface of the substrate 102 and is disposed at a position that is not visible in FIG. 2(a). Note that the number of screws 110 used for fastening and the fastening positions can be arbitrary determined, and it is advantageous to reduce the number of screws and fastening positions as much as possible from the viewpoint of manufacturing cost.

Meanwhile, FIG. 2(b) is a diagram showing the portion (contact portion) 106 of contact between the substrate 102 and the metal housing 101. As described above with reference to FIG. 1, the substrate 102-side is covered with solder resist, and electric connection between the substrate 102 and the metal housing 101 is prevented. Further, the inner-layer copper foil pattern 105 inside serves as a ground of the electronic control device, and has a shape substantially similar to the outer shape of the substrate 102 and is formed such that the entire inner layer is painted out thereby.

At the contact portion 106 between the substrate 102 and the metal housing 101, two pieces of metal, i.e., the inner-layer copper foil pattern 105 of the substrate 102 and the metal housing 101, face one another and form an electrostatic coupling capacitance C satisfying the relationship in the following expression.

(Equation 1)

$$C = \varepsilon S/d \quad (1)$$

Here, s is the area of the contact portion 106 between the substrate 102 and the metal housing 101, which is shown in FIG. 2(b). The area s is determined by the width and the length of the outer periphery of the contact portion 106. d is the distance between the substrate 102 and the metal housing 101. ε is the dielectric constant between the substrate 102 and the metal housing 101 and is a fixed value. Therefore, the electrostatic coupling capacitance C formed at the contact portion 106 between the substrate 102 and the metal housing 101 is proportional to the area of the contact portion 106 between the substrate 102 and the metal housing 101 and is inversely proportional to the distance between the substrate 102 and the metal housing 101.

Figure 3:
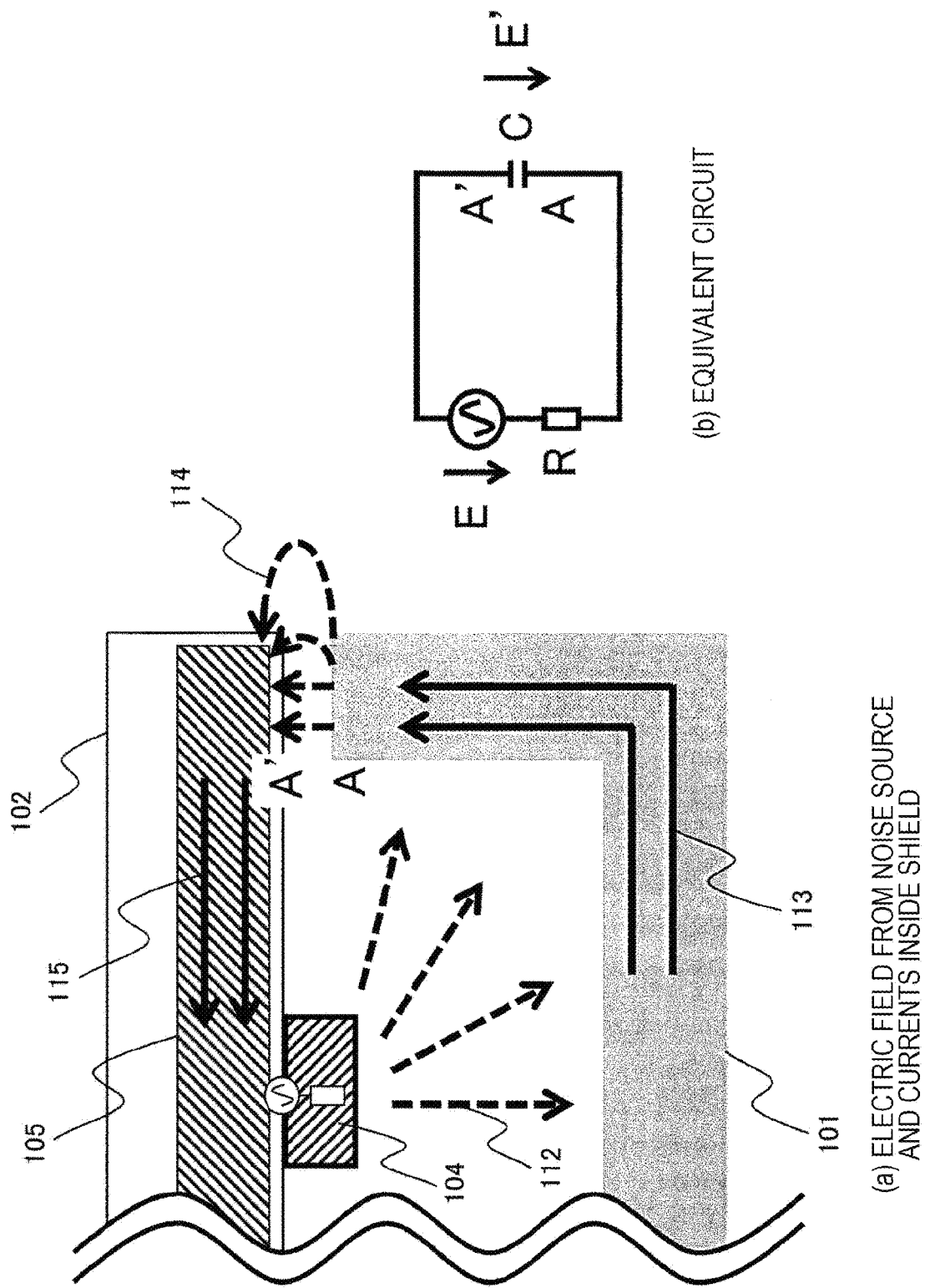
FIG. 3 is a diagram describing electromagnetic waves emitted from a noise source and currents inside metal, in the electronic control device according to one embodiment of the present invention.

FIG. 3 is a diagram describing electromagnetic waves radiated from the noise source and currents inside metal, in the electronic control device according to the present embodiment.

In FIG. 3, when electromagnetic waves 112 are radiated from the radiation noise source 104, a current 113 flows in the surface of the metal housing 101 so as to cancel the electromagnetic waves 112. The current 113 flowing in the metal housing 101 is re-radiated at an edge A. If the boundaries A and A' of the metal housing 101 and the substrate 102 are close to one another, the current 113 in the metal housing 101 becomes a current 115 flowing in the inner-layer copper foil pattern 105 in the substrate 102 due to the capacitive coupling C, and it becomes possible to prevent radiation to the outside.

Figure 4:
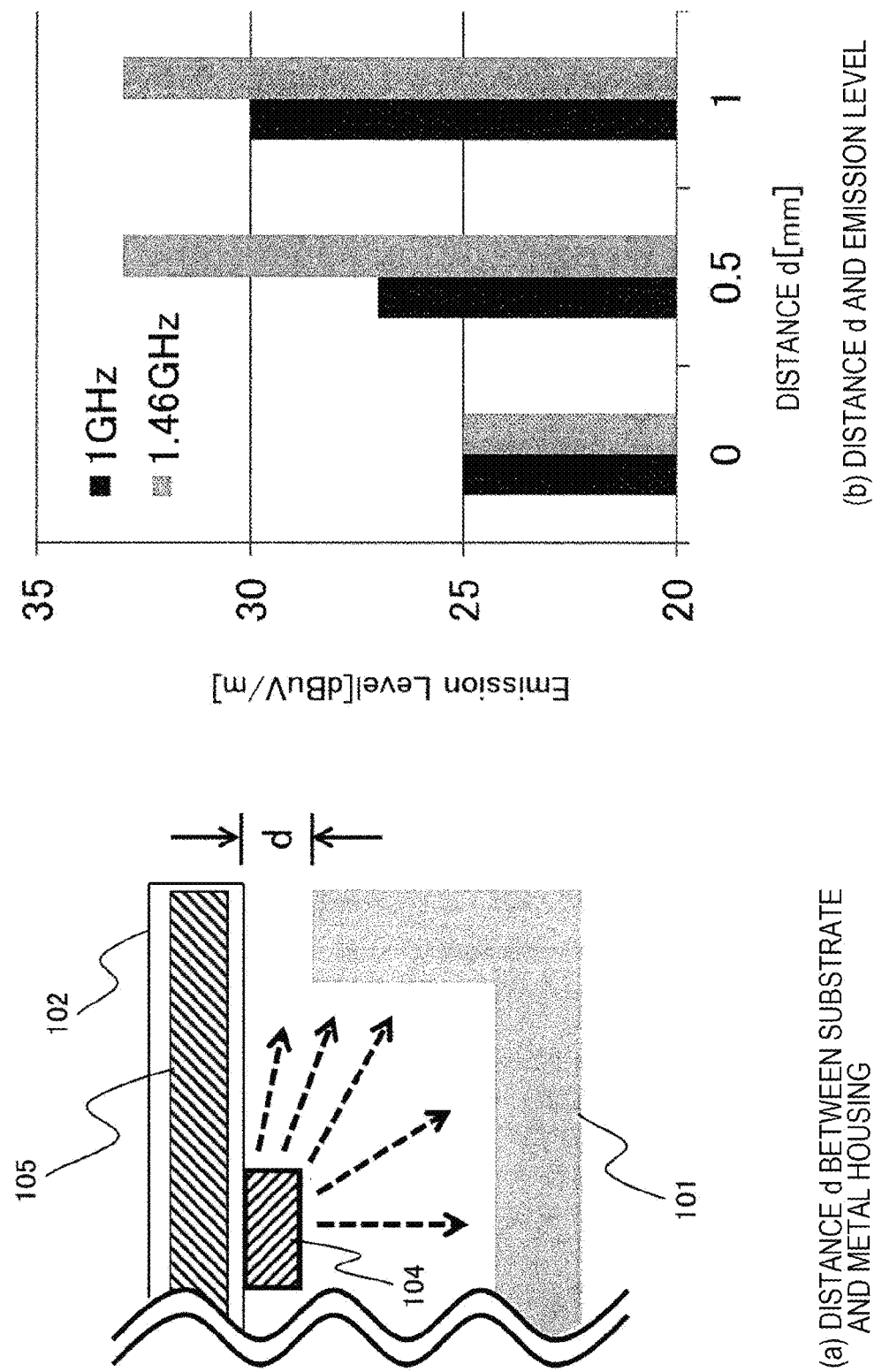
FIG. 4, with regard to the electronic control device according to one embodiment of the present invention, shows experiment results obtained by measuring emission levels using an actual device.

FIG. 4, with regard to the electronic control device according to the present embodiment, shows experiment results obtained by measuring emission levels using an actual device.

FIG. 4(b) shows emission levels received by an (unillustrated) antenna installed at the outside of the electronic control device, when the distance d between the substrate 102 having the radiation noise source mounted thereon and the metal housing 101 was set to 0 mm, 0.5 mm, and 1.0 mm in FIG. 4(a). As shown by the emission levels in FIG. 4(b), it was confirmed that, in the 1 GHz and 1.46 GHz bands, the coupling capacitance becomes smaller and the emission level increases in accordance with the distance d when the distance between the substrate 102 and the metal housing 101 is increased from 0 mm to 0.5 mm, and then to 1.0 mm.

If the metal housing 101 and the substrate 102 are close to one another, radiation to the outside can be prevented by the capacitive coupling C at the contact portion 106. However, there is a limit to the distance d between the substrate 102 and the metal housing 101 because there is a concern that the metal housing 101 and the substrate 102 may come in contact due to warping thereof when vibration occurs. Therefore, in order to secure the width of the contact portion 106 and in view of shield integrity, it is desirable that the metal portion 105 and the metal housing 101 face one another throughout the entire perimeter of the outer edge of the substrate 102 without openings.

Note that, in order to secure the electrostatic capacitance of the contact portion 106 between the substrate 102 and the metal housing 101, it is desirable that there is no through via/surface pattern in/on the substrate 102 at the contact portion 106. Further, the radiation noise source 104 is one of a control processor, a memory, a termination resistor of a clock line, a communication circuit, and a power supply circuit, and it is desirable that these be mounted on the surface opposite from a mounting surface of a resin connector.

The embodiment described above for example includes: a metal housing 101; a substrate 102; a radiation noise source 104; a metal portion (inner-layer copper foil pattern) 105 provided inside the substrate 102; a contact portion 106 between the substrate 102 and the metal housing 101; and a shield space 110.

The radiation noise source 104 is mounted on the substrate 102, and the surface on which the radiation noise source 104 is mounted is covered by the metal housing 101. The radiation noise source 104 is disposed inside the shield space 110, which is formed by the metal housing 101 and the metal portion 105 provided in the substrate 102. The metal portion 105 and the metal housing 101 are coupled by electrostatic capacitance at the contact portion 106 between the substrate 102 and the metal housing 101.

Further, the metal portion 105 and the metal housing 101 face one another at least at the outer peripheral edge of the substrate 102, and are coupled by electrostatic capacitance determined by the width and the outer peripheral length of the contact portion 106 to form the shield space 110.

Note that, in view of shield integrity, it is desirable that the contact portion 106 face the substrate 102 throughout the entire perimeter of the outer edge of the substrate 102 without openings, or that is, it is desirable for the contact portion 106 to be closed.

The metal portion 105 may be formed from a copper foil pattern provided inside the substrate 102, and may be an electronic control device ground or power source that is located at an inner layer or surface layer of the substrate 102 and has a large area.

In order to secure electrostatic capacitance at the contact portion 106 between the substrate 102 and the metal housing 101, it is desirable that there is no through-via/surface pattern present in/on the substrate 102 at the contact portion 106. Further, the radiation noise source 104 is one of a control processor, a LSI, a FPGA, a memory, a termination resistor of a clock line, a communication circuit, and a power supply circuit, and it is preferable that these be mounted on the surface opposite from a mounting surface of a resin connector.

According to the above-described embodiment, a shield effect against noise radiated from an electronic component can be obtained in a vehicle control device. Furthermore, in addition to the shield effect, a housing structure and a mounting method that can also realize cost reduction of an inter-component contact portion forming the shield space can be realized.

REFERENCE SIGNS LIST 101 metal housing
102 substrate
103 electronic components
104 radiation noise source
105 inner-layer copper foil pattern (metal portion)
106 contact portion
107 mounting portion
108 width of solder resist
109 width of substrate contact
110 shield space
111 screws
112 radiated electromagnetic waves
113 noise current in metal housing
114 re-radiated electromagnetic field
115 noise current in inner-layer copper foil pattern

The invention claimed is:

1. An electronic control device comprising:
an electronic component;
a metal housing which covers at least a part of the electronic component;
a metal portion which is provided so that the electronic component is disposed between the metal portion and the metal housing;
a shield structure which shields radiation noise from the electronic component by electrostatic capacitive coupling formed between the metal portion and the metal housing, wherein the metal portion is provided inside a substrate having the electronic component mounted thereon; and
a contact portion between the substrate and the metal housing, the contact portion being sandwiched therebetween and contacting both the substrate and the metal housing, the contact portion being covered by resist and preventing electrical connection between the substrate and the metal housing, wherein the contact portion extends only in an outer periphery of the substrate, and extends along an entirety of the outer periphery of the substrate.

2. The electronic control device according to claim 1, wherein the metal portion and the metal housing face one another via an insulator of the substrate having the electronic component mounted thereon.

3. The electronic control device according to claim 1, wherein the metal portion is disposed at the outer periphery of the substrate having the electronic component mounted thereon, and the metal portion faces the metal housing throughout the outer periphery of the substrate.

4. The electronic control device according to claim 1, wherein the metal portion and the metal housing are coupled by electrostatic capacitance dependent upon a width and an outer peripheral length over which the metal portion and the metal housing face one another to form a shield space covering the radiation noise.

5. The electronic control device according to claim 4, wherein the metal portion and the metal housing are such that the shield space is closed.

6. The electronic control device according to claim 1, wherein the metal portion is a copper foil pattern provided inside the substrate, and is connected to a ground or a power source, or is a ground or a power source.

7. The electronic control device according to claim 6, wherein the copper foil pattern is formed in an inner layer of the substrate.

8. The electronic control device according to claim 6, wherein the copper foil pattern is disposed at the outer periphery of the substrate.

9. The electronic control device according to claim 1, wherein a source of the radiation noise is mounted on a surface opposite from a resin connector mounted on the substrate.

10. The electronic control device according to claim 1, wherein a source of the radiation noise is one of a control processor, a memory, a termination resistor of a clock line, a communication circuit, or a power supply circuit.

11. An electronic control device comprising:
a substrate on which a plurality of electronic components are mounted;
a metal housing having a housing space for housing the plurality of electronic components,
wherein a mounting portion on which an outer peripheral edge portion of the substrate is mounted is formed on an entire circumference of the metal housing so as to surround an outer periphery of the housing space, and
the substrate has a metal portion that covers the housing space and is capacitively coupled to the mounting portion of the metal housing; and
a contact portion between the substrate and the metal housing, the contact portion being sandwiched therebetween and contacting both the substrate and the metal housing, the contact portion being covered by resist and preventing electrical connection between the substrate and the metal housing, wherein the contact portion extends only in an outer periphery of the substrate, and extends along an entirety of the outer periphery of the substrate.

12. The electronic control device according to claim 11, further comprising:

a connector configured to communicate signals with an outside of the metal housing, the connector mounted on a surface of the substrate opposite to the housing space.

* * * * *